United States Patent
Lee et al.

(10) Patent No.: US 12,082,459 B2
(45) Date of Patent: Sep. 3, 2024

(54) DISPLAY APPARATUS WITH CONNECTION LINES HAVING DIFFERENT CURVATURES BYPASSING TRANSMISSION AREA

(71) Applicant: Samsung Display Co., Ltd., Yongin-si (KR)

(72) Inventors: Seulbee Lee, Yongin-si (KR); Minchae Kwak, Yongin-si (KR); Byungsun Kim, Yongin-si (KR); Seunghan Jo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 568 days.

(21) Appl. No.: 17/240,814

(22) Filed: Apr. 26, 2021

(65) Prior Publication Data

US 2021/0391408 A1    Dec. 16, 2021

(30) Foreign Application Priority Data

Jun. 15, 2020  (KR) ......................... 10-2020-0072602

(51) Int. Cl.
*H10K 59/131* (2023.01)
*H10K 59/121* (2023.01)
(Continued)

(52) U.S. Cl.
CPC ......... *H10K 59/131* (2023.02); *H10K 59/121* (2023.02); *H10K 59/126* (2023.02);
(Continued)

(58) Field of Classification Search
CPC .... H10K 59/131; H10K 59/65; H10K 59/126; H10K 59/121; G09G 3/3233;
(Continued)

(56) References Cited

U.S. PATENT DOCUMENTS

| | | |
|---|---|---|
| 7,830,591 B2 | 11/2010 | Shimodaira |
| 10,193,102 B2 | 1/2019 | Kanaya |

(Continued)

FOREIGN PATENT DOCUMENTS

| | | |
|---|---|---|
| CN | 108919581 A | 11/2018 |
| JP | 2018-087863 A | 6/2018 |

(Continued)

*Primary Examiner* — Lex H Malsawma
(74) *Attorney, Agent, or Firm* — Lewis Roca Rothgerber Christie LLP

(57) ABSTRACT

A display apparatus includes: a substrate having a transmission area and a display area surrounding the transmission area; a plurality of display elements in the display area; a horizontal line extending in a first direction in the display area; a plurality of first vertical lines and a plurality of second vertical lines extending in a second direction intersecting the first direction and being apart from each other with the transmission area therebetween; a first connection line connecting at least one of the plurality of first vertical lines to at least one of the plurality of second vertical lines and bypassing the transmission area; and a second connection line connecting at least one of the plurality of first vertical lines to at least one of the plurality of second vertical lines and bypassing the transmission area, the second connection line being on a layer different from the first connection line, wherein a curvature of the first connection line is different from a curvature of the second connection line.

19 Claims, 18 Drawing Sheets

(51) Int. Cl.
*H10K 59/126* (2023.01)
*H10K 59/65* (2023.01)
*G09G 3/3233* (2016.01)
*G09G 3/3266* (2016.01)

(52) U.S. Cl.
CPC ........... *H10K 59/65* (2023.02); *G09G 3/3233* (2013.01); *G09G 3/3266* (2013.01); *G09G 2300/0426* (2013.01); *G09G 2300/0842* (2013.01)

(58) Field of Classification Search
CPC ......... G09G 3/3266; G09G 2300/0426; G09G 2300/0842
See application file for complete search history.

(56) References Cited

U.S. PATENT DOCUMENTS

| | | | |
|---|---|---|---|
| 10,304,913 B2 | 5/2019 | Choi et al. | |
| 10,381,581 B2 | 8/2019 | Jeong et al. | |
| 2017/0162637 A1* | 6/2017 | Choi | G09G 3/20 |
| 2017/0294502 A1* | 10/2017 | Ka | H10K 59/123 |
| 2019/0245029 A1* | 8/2019 | Ka | H10K 71/00 |
| 2020/0175918 A1* | 6/2020 | An | H10K 59/131 |
| 2020/0176542 A1* | 6/2020 | Park | H10K 59/131 |
| 2020/0176657 A1* | 6/2020 | Jang | G06F 1/1626 |
| 2020/0312944 A1* | 10/2020 | Ka | H10K 71/00 |
| 2021/0066433 A1 | 3/2021 | Cha et al. | |

FOREIGN PATENT DOCUMENTS

| | | |
|---|---|---|
| KR | 10-2017-0066767 A | 6/2017 |
| KR | 10-2018-0034780 A | 4/2018 |
| KR | 10-2021-0025748 A | 3/2021 |

\* cited by examiner

DISPLAY APPARATUS WITH CONNECTION LINES HAVING DIFFERENT CURVATURES BYPASSING TRANSMISSION AREA

CROSS-REFERENCE TO RELATED APPLICATION

The present application claims priority to and the benefit of Korean Patent Application No. 10-2020-0072602, filed on Jun. 15, 2020, in the Korean Intellectual Property Office, the entire disclosure of which is incorporated by reference herein.

BACKGROUND

1. Field

Aspects of one or more embodiments relate to a display apparatus.

2. Description of Related Art

Recently, the various potential uses for display apparatuses has become more diversified. Also, display apparatuses have become relatively thinner and lighter, and thus, the use of display apparatuses has expanded.

By increasing an area of a display area in a display apparatus, various functions may be added or connected to the display apparatus. In order to increase the area and add various functions, studies have been conducted into a display apparatus having a display area including an area for adding various functions other than an image displaying function.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus having a display panel including a transmission area.

In order to increase the number of functions capable of being connected or related to a display apparatus, one or more example embodiments include a display panel having a transmission area including a display area in which a camera, a sensor, or the like may be arranged, and a display apparatus including the display panel.

One or more example embodiments include a display panel and a display apparatus in which an area occupied by wirings bypassing a transmission area may be reduced.

However, this is merely an example, and the scope of embodiments according to the disclosure is not limited thereby.

Additional aspects will be set forth in part in the description which follows and, in part, will be apparent from the description, or may be learned by practice of the presented example embodiments of the disclosure.

According to one or more example embodiments, a display apparatus includes a substrate having a transmission area and a display area surrounding the transmission area, a plurality of display elements arranged in the display area, a horizontal line extending in a first direction in the display area, a plurality of first vertical lines and a plurality of second vertical lines extending in a second direction intersecting the first direction and being apart from each other with the transmission area therebetween, a first connection line connecting at least one of the plurality of first vertical lines to at least one of the plurality of second vertical lines and bypassing the transmission area, and a second connection line connecting at least one of the plurality of first vertical lines to at least one of the plurality of second vertical lines and bypassing the transmission area, the second connection line being arranged on a layer different from the first connection line, wherein a curvature of the first connection line is different from a curvature of the second connection line.

According to some example embodiments, the first connection line may be formed to be closer to the transmission area than the second connection line, and a distance between a point on the second connection line and a center point of the transmission area may become shorter toward a center of the second connection line.

According to some example embodiments, the first connection line may overlap the second connection line in a partial area.

According to some example embodiments, the first connection line may be provided on the same layer as the horizontal line.

According to some example embodiments, the first connection line may be connected to at least one of the plurality of first vertical lines via a first contact hole, and the first contact hole may be between the second connection line and the transmission area.

According to some example embodiments, the first connection line may be connected to at least one of the plurality of first vertical lines via a first contact hole, the second connection line may be connected to at least one of the plurality of first vertical lines via a second contact hole, and the first contact hole may be formed to be closer to the transmission area than the second contact hole.

According to some example embodiments, a thin-film transistor including a first semiconductor layer and a first gate electrode may be arranged in the display area, and the first connection line may be arranged on the same layer as the first gate electrode.

According to some example embodiments, the display apparatus may further include a data line connected to the thin-film transistor, and a first planarization layer covering the data line, wherein the second connection line may be arranged on the first planarization layer.

According to some example embodiments, the first connection line may include a plurality of $(1\text{-}1)^{th}$ connection lines and a plurality of $(1\text{-}2)^{th}$ connection lines arranged on different layers, wherein the plurality of $(1\text{-}1)^{th}$ connection lines and the plurality of $(1\text{-}2)^{th}$ connection lines may be alternately arranged.

According to some example embodiments, the second connection line may include a plurality of $(2\text{-}1)^{th}$ connection lines and a plurality of $(2\text{-}2)^{th}$ connection lines arranged on different layers, wherein the plurality of $(2\text{-}1)^{th}$ connection lines and the plurality of $(2\text{-}2)^{th}$ connection lines may be alternately arranged.

According to one or more example embodiments, a display apparatus includes a substrate having a transmission area, a display area surrounding the transmission area, and a non-display area between the transmission area and the display area, a plurality of display elements arranged in the display area, a horizontal line extending in a first direction in the display area, a plurality of first vertical lines and a plurality of second vertical lines extending in a second direction intersecting the first direction and being apart from each other with the transmission area therebetween, a first connection line arranged in the non-display area and connecting at least one of the plurality of first vertical lines to at least one of the plurality of second vertical lines via a first contact hole, and a second connection line arranged in the non-display area and connecting at least one of the plurality of first vertical lines to at least one of the plurality of second vertical lines via a second contact hole, wherein the first contact hole is formed to be closer to the transmission area than the second contact hole.

According to some example embodiments, the horizontal line may be bent to bypass the transmission area in the non-display area, and the horizontal line may be between the first contact hole and the second contact hole.

According to some example embodiments, a curvature of the first connection line may be different from a curvature of the second connection line.

According to some example embodiments, the first connection line may have a curvature approximately identical to that of a circle, and the second connection line may have a curvature approximately identical to that of an ellipse.

According to some example embodiments, a central portion of the first connection line may overlap a central portion of the second connection line in a plan view.

According to some example embodiments, a thin-film transistor including a first semiconductor layer and a first gate electrode may be arranged in the display area, and the first connection line may be arranged on the same layer as the first gate electrode.

According to some example embodiments, the display apparatus may further include a data line connected to the thin-film transistor, and a first planarization layer covering the data line, wherein the second connection line may be arranged on the first planarization layer.

According to some example embodiments, the first connection line may be provided on the same layer as the horizontal line.

According to some example embodiments, the first connection line may include a plurality of $(1-1)^{th}$ connection lines and a plurality of $(1-2)^{th}$ connection lines arranged on different layers, wherein the plurality of $(1-1)^{th}$ connection lines and the plurality of $(1-2)^{th}$ connection lines may be alternately arranged.

According to some example embodiments, the second connection line may include a plurality of $(2-1)^{th}$ connection lines and a plurality of $(2-2)^{th}$ connection lines arranged on different layers, and the plurality of $(2-1)^{th}$ connection lines and the plurality of $(2-2)^{th}$ connection lines may be alternately arranged.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
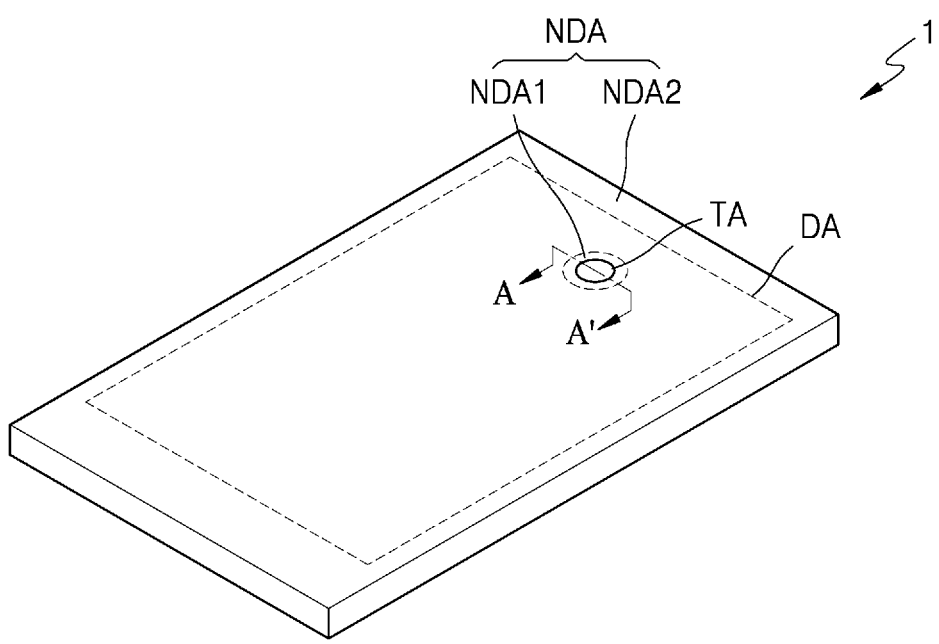
FIG. 1 is a schematic perspective view of a display apparatus according to some example embodiments.

Reference will now be made in detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, aspects of some example embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. That is, for example, intervening layers, regions, or elements may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. That is, for example, intervening layers, regions, or elements may be present.

FIG. 1 is a schematic perspective view of a display apparatus 1 according to some example embodiments.

Referring to FIG. 1, the display apparatus 1 may include a display area DA at which light is emitted and a non-display area NDA at which no light is emitted. The display apparatus 1 may provide a certain image by using light emitted from a plurality of pixels arranged in the display area DA.

The display apparatus 1 includes a transmission area TA. The transmission area TA may be surrounded by the display area DA. The transmission area corresponds to an area through which the light or/and sound output from an electronic element to the outside or traveling from the outside toward the electronic element may be transmitted. According to some example embodiments, when light is transmitted through the transmission area TA, the light transmittance is about 50% or more, more preferably about 70% or more, about 75% or more, about 80% or more, about 85% or more, or about 90% or more.

A first non-display area NDA1 is between the transmission area TA and the display area DA. The first non-display area NDA1 may be arranged to surround the transmission area TA. In the first non-display area NDA1, pixels implementing an image are not arranged. Wirings configured to transmit electrical signals to the pixels apart from each other with the transmission area TA therebetween may be arranged.

A second non-display area NDA2 extends along the edge of the display apparatus 1 and is arranged to surround the display area DA. Pixels implementing an image are not arranged in the second non-display area NDA2, and various types of wirings and built-in circuits may be arranged in the second non-display area NDA2.

Each of the pixels provided in the display apparatus 1 may include a light-emitting diode as a display element capable of emitting light of a certain color. The light-emitting diode may include an organic light-emitting diode including an organic material as an emission layer. Alternatively, the light-emitting diode may include an inorganic light-emitting diode. Alternatively, the light-emitting diode may include quantum dots as an emission layer. According to some example embodiments, the display apparatus 1 may include a liquid crystal display apparatus.

Hereinafter, for convenience of description, a case in which the display apparatus 1 is an organic light-emitting display apparatus including an organic light-emitting diode will be described as an example.

According to some example embodiments, as illustrated in FIG. 1, the transmission area TA may be arranged at the central portion of the display area DA in the width direction of the display apparatus 1 and at the upper side of the display area DA in the length direction of the display apparatus 1. According to some example embodiments, the transmission area TA may be arranged at the central portion in the length direction of the display apparatus 1 or may be offset to the lower side. Alternatively, the transmission area TA may be arranged to be offset to the left or right side in the width direction.

The shape of the display area DA may be a circle, an ellipse, or a polygon such as a triangle or a pentagon. The size, shape, number, and position of the transmission area TA may also be variously changed.

FIGS. 2A to 2D are schematic cross-sectional views of display apparatuses 1 taken along the line A-A' of FIG. 1, according to some example embodiments.

Figure 2A:
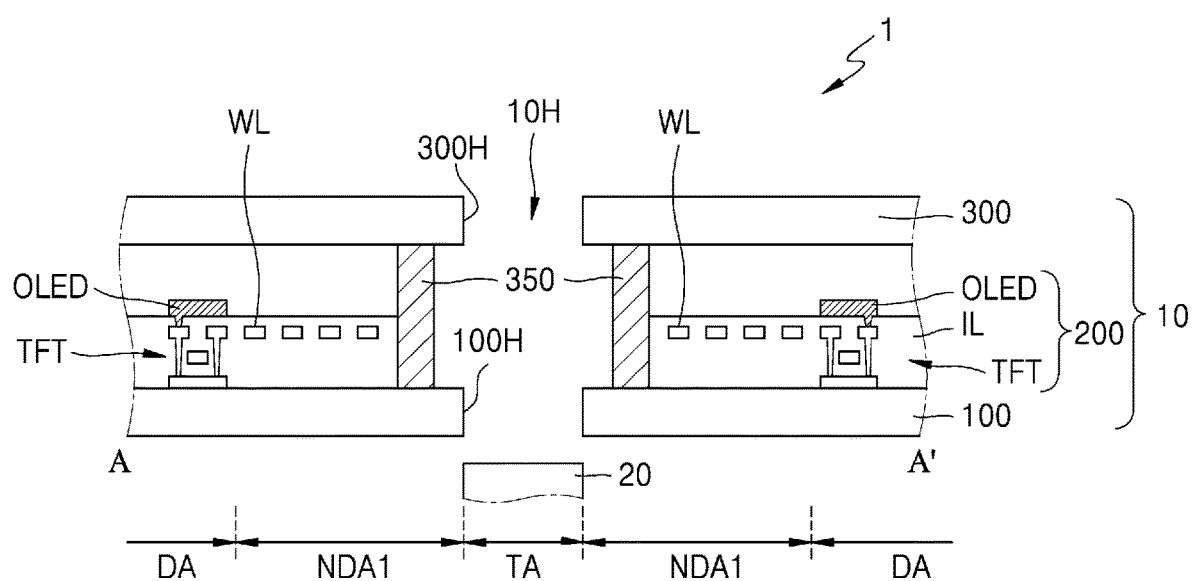
FIGS. 2A to 2D are schematic cross-sectional views of display apparatuses according to some example embodiments.

Referring to FIG. 2A, the display apparatus 1 may include a display panel 10 including a display element, and a component 20 corresponding to a transmission area TA.

The display panel 10 may include a substrate 100, an encapsulation substrate 300 as an encapsulation member facing the substrate 100, and a display element layer 200 therebetween. A sealant 350 may be between the substrate 100 and the encapsulation substrate 300 to cover the side surface of the display element layer 200. FIG. 2A illustrates that the sealant 350 is arranged on both sides of the transmission area TA, but when seen in a direction perpendicular to a main surface of the substrate 100, it may be understood that the transmission area TA is entirely surrounded by the sealant 350.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multilayer structure including a layer including the above-described polymer resin and an inorganic layer. The encapsulation substrate 300 may include glass or the above-described polymer resin.

The display element layer 200 may include a circuit layer including a thin-film transistor TFT, an organic light-emitting diode OLED as a display element connected to the thin-film transistor TFT, and insulating layer IL therebetween. The thin-film transistor TFT and the organic light-emitting diode OLED connected thereto may be arranged in a display area DA, and some wirings WL of the display element layer 200 may be located in a first non-display area NDA1. The wirings WL may provide a certain signal or voltage to pixels apart from each other with the transmission area TA therebetween. FIG. 2A illustrates that the wirings WL do not overlap the sealant 350 in the first non-display area NDA1, but according to some example embodiments, a portion of the sealant 350 may also be arranged on the wirings WL.

The display panel 10 may include a via hole 10H corresponding to the transmission area TA. For example, the substrate 100 and the encapsulation substrate 300 may include via holes 100H and 300H corresponding to the transmission area TA, respectively. The display element layer 200 may also include a via hole corresponding to the transmission area TA.

According to some example embodiments, elements such as an input sensing member configured to sense a touch input, a polarizer, a retarder, a color filter, an anti-reflection member including a black matrix, and a transparent window may be further arranged in the display panel 10.

The component 20 may be located in the transmission area TA. The component 20 may be an electronic element that uses light or sound. For example, the electronic element may include a sensor (e.g., infrared sensor) configured to receive and use light, a camera configured to receive light and capture an image, a sensor configured to output and sense light or sound so as to measure a distance or recognize a fingerprint, a small lamp configured to output light, a speaker configured to output sound, and the like. When the component 20 is an electronic element using light, the component 20 may use light of various wavelength bands, such as visible light, infrared light, and ultraviolet light. As illustrated in FIG. 2A, when the display panel 10 includes the via hole 10H corresponding to the transmission area TA, light or sound output or received by the electronic element may be more effectively utilized.

Figure 2B:
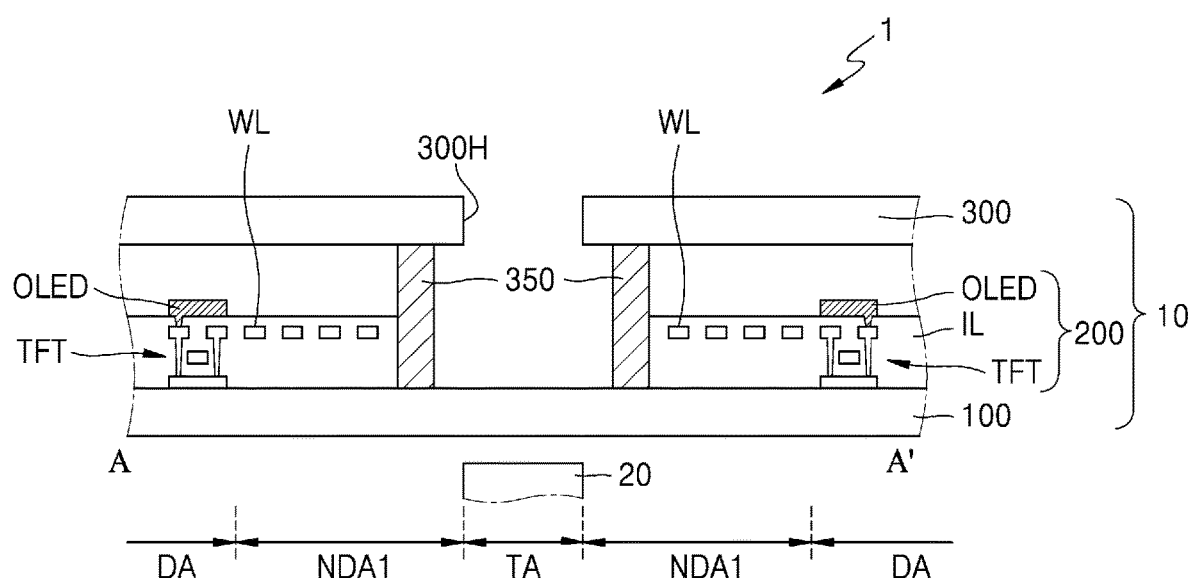
Figure 2C:
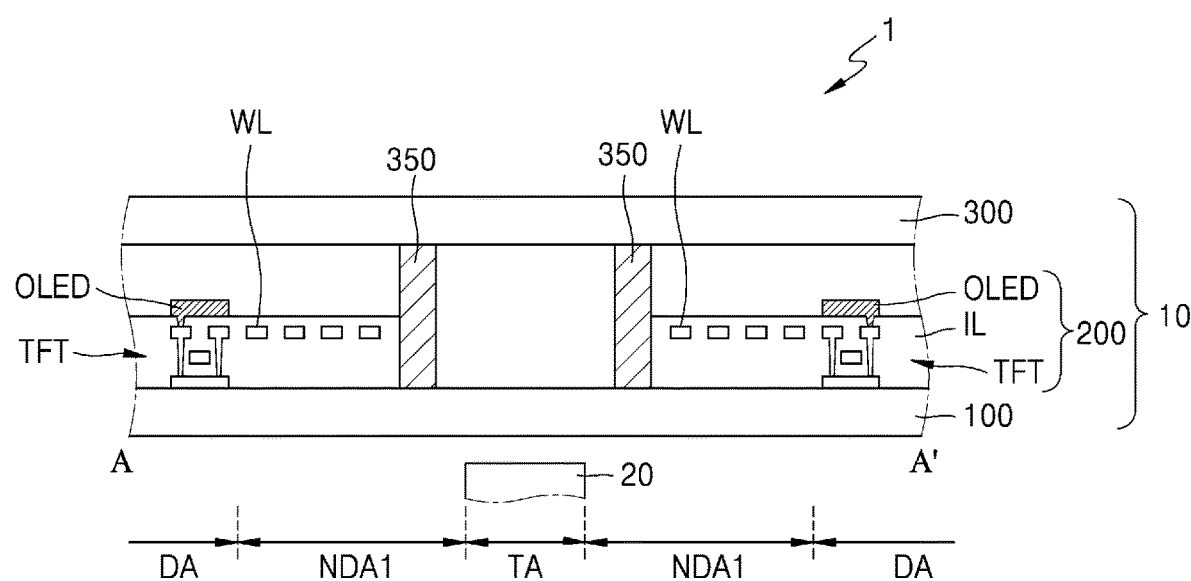
Figure 2D:
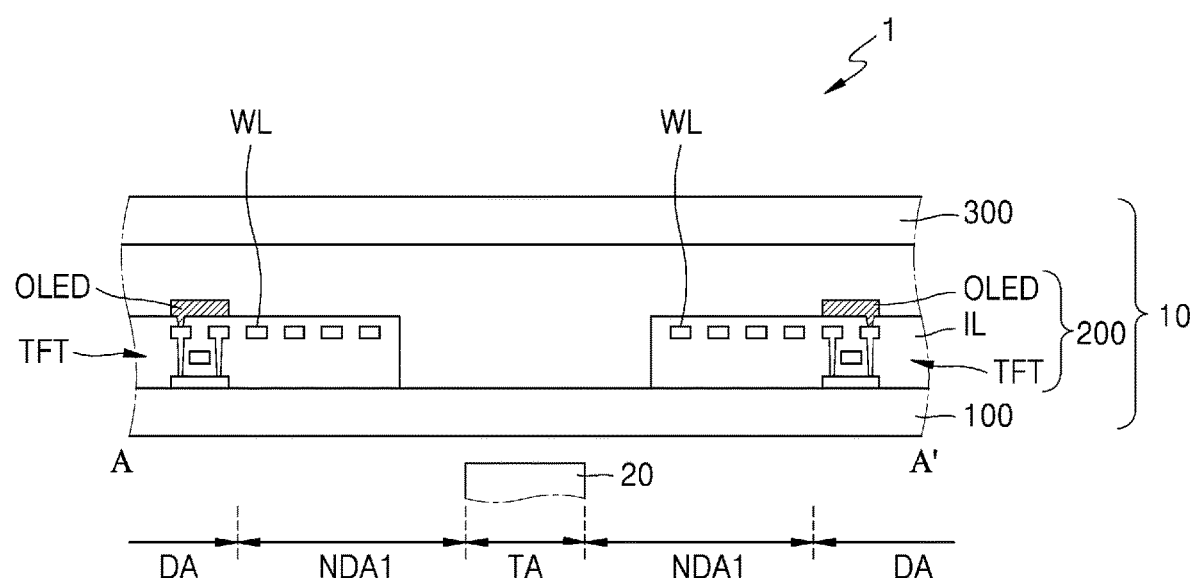

Unlike the display panel 10 including the via hole 10H corresponding to the transmission area TA in FIG. 2A, some elements of the display panel 10 may not include the via hole. For example, as illustrated in FIG. 2B, the encapsulation substrate 300 includes the via hole 300H corresponding to the transmission area TA, but the substrate 100 may not include the via hole. Alternatively, as illustrated in FIGS. 2C and 2D, both the substrate 100 and the encapsulation substrate 300 may not include via holes corresponding to the transmission area TA. As illustrated in FIGS. 2B to 2D, even when the substrate 100 does not include the via hole 100H, portions of the display element layer 200 corresponding to the transmission area TA are removed, such that light transmittance for the electronic element may be secured. Therefore, when the display apparatus 1 includes the display panel 10 illustrated in FIGS. 2B to 2D, it may be appropriate to employ the electronic element using light.

As illustrated in FIG. 2D, the display panel 10 may not include the sealant 350 around the transmission area TA. In the display panel 10 of FIG. 2D, because the substrate 100 and the encapsulation substrate 300 do not include the via holes corresponding to the transmission area TA, external air may not penetrate into the transmission area TA.

The component 20 illustrated in FIGS. 2A to 2D may be located inside the via hole 10H so as to overlap the side surface of the display panel 10 defining the via hole 10H.

The component 20 may be a member other than the above-described electronic element. According to some example embodiments, when the display panel 10 is used as a smart watch or a dashboard for a vehicle, the component 20 may be a member such as a clock hand or a needle indicating certain information (e.g., vehicle velocity, etc.). Alternatively, the component 20 may include an element such as an accessory that increases the aesthetics of the display panel 10.

Figure 3A:
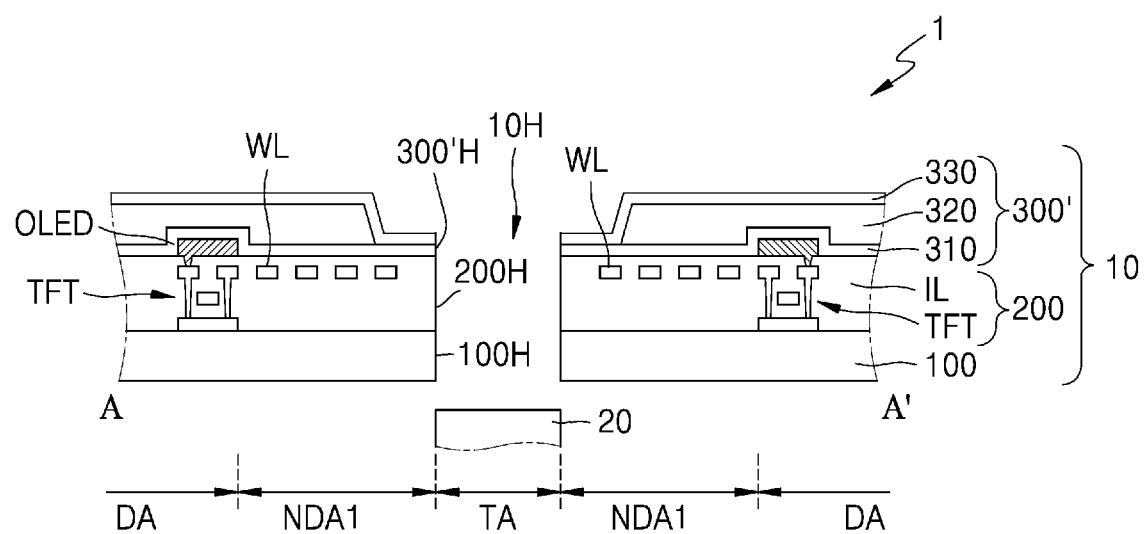
FIGS. 3A to 3C are cross-sectional views of display apparatuses according to some example embodiments.
Figure 3B:
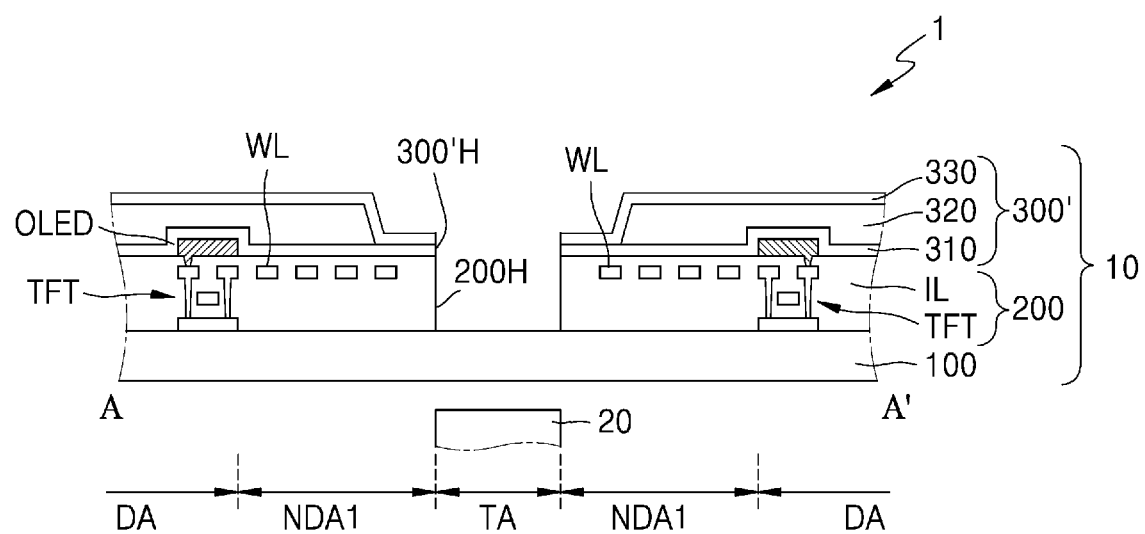
Figure 3C:
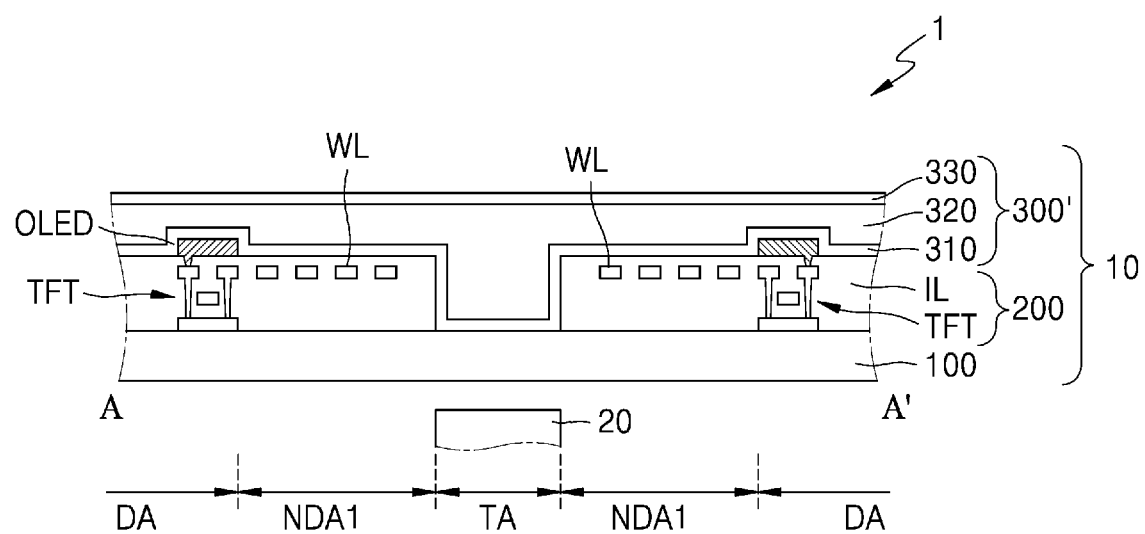

FIGS. 3A to 3C are cross-sectional views of display apparatuses 1 taken along the line A-A' of FIG. 1, according to some example embodiments.

Referring to FIG. 3A, the display apparatus 1 may include a display panel 10 and a component 20, like the display apparatus 1 described above with reference to FIG. 2A. Also, according to some example embodiments, the display apparatus 1 may further include an input sensing member configured to sense a touch input, an anti-reflection member, and a window, which are arranged on the display panel 10.

Although the display panel 10 described above with reference to FIG. 2A includes the encapsulation substrate 300 as the encapsulation member and the sealant 350, the display panel 10 according to some example embodiments may include a thin-film encapsulation layer 300' as an encapsulation member. In this case, the flexibility of the display panel 10 may be further improved. Hereinafter, for convenience of description, the description will be given focusing on differences.

The thin-film encapsulation layer 300' may include at least one inorganic encapsulation layer and at least one organic encapsulation layer. In this regard, first and second inorganic encapsulation layers 310 and 330 and an organic encapsulation layer 320 therebetween are illustrated in FIG. 3A.

The first and second inorganic encapsulation layers 310 and 330 may each include at least one inorganic insulating material selected from silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The organic encapsulation layer 320 may include a polymer-based material. Examples of the polymer-based material may include an acrylic resin, an epoxy resin, polyimide, and/or polyethylene.

The display panel 10 may include a via hole 10H corresponding to the transmission area TA. For example, the substrate 100 and the thin-film encapsulation layer 300' may include via holes 100H and 300'H corresponding to the transmission area TA, respectively. The first and second inorganic encapsulation layers 310 and 330 and the organic encapsulation layer 320 may include holes corresponding to the transmission area TA, respectively. The size of the hole of the organic encapsulation layer 320 may be greater than the sizes of the holes of the first and second inorganic encapsulation layers 310 and 330. Therefore, the first and second inorganic encapsulation layers 310 and 330 may be in contact with each other around the transmission area TA.

Unlike the display panel 10 including the via hole 10H corresponding to the transmission area TA in FIG. 3A, the display panel 10 may not include the via hole. As illustrated in FIG. 3B, the thin-film encapsulation layer 300' includes the via hole 300'H corresponding to the transmission area TA, but the substrate 100 may not include the via hole. Alternatively, as illustrated in FIG. 3C, both the substrate 100 and the thin-film encapsulation layer 300' may not include via holes corresponding to the transmission area TA. As illustrated in FIGS. 3B and 3C, even when the substrate 100 does not include the via hole 100H, portions of the display element layer 200 corresponding to the transmission area TA are removed, such that light transmittance for the electronic element that is the component 20 may be secured.

When the thin-film encapsulation layer 300' does not include the via hole as illustrated in FIG. 3C, the at least one inorganic encapsulation layer and the at least one organic encapsulation layer may each cover the substrate 100 in the transmission area TA. In this case, a portion of the display element layer 200 corresponding to the transmission area TA between the substrate 100 and the thin-film encapsulation layer 300' may be removed. Although FIG. 3A illustrates that the insulating layer IL corresponding to the transmission area TA is entirely removed, only some of the multilayer insulating layers IL may be removed.

The component 20 may be located inside the via hole 10H so as to overlap the side surface of the display panel 10 defining the via hole 10H. For example, the component 20 may be located inside the via hole 100H of the substrate 100 and the via hole 200H of the display element layer 200 as illustrated in FIG. 3A. Alternatively, the component 20 may be located inside the via hole 200H of the display element layer 200 as illustrated in FIG. 3B.

FIGS. 2A to 2C illustrate a case in which the display panel 10 includes only the encapsulation substrate 300 as the encapsulation member and FIGS. 3A to 3C illustrate that the display panel 10 includes only the thin-film encapsulation layer 300' as the encapsulation member, but the display panel according to some example embodiments may include both the encapsulation substrate 300 and the thin-film encapsulation layer 300'. For example, the display panel 10 may include any one of the encapsulation substrates 300 illustrated in FIGS. 2A to 2C and any one of the thin-film encapsulation layer 300' illustrated in FIGS. 3A to 3C.

Figure 4:
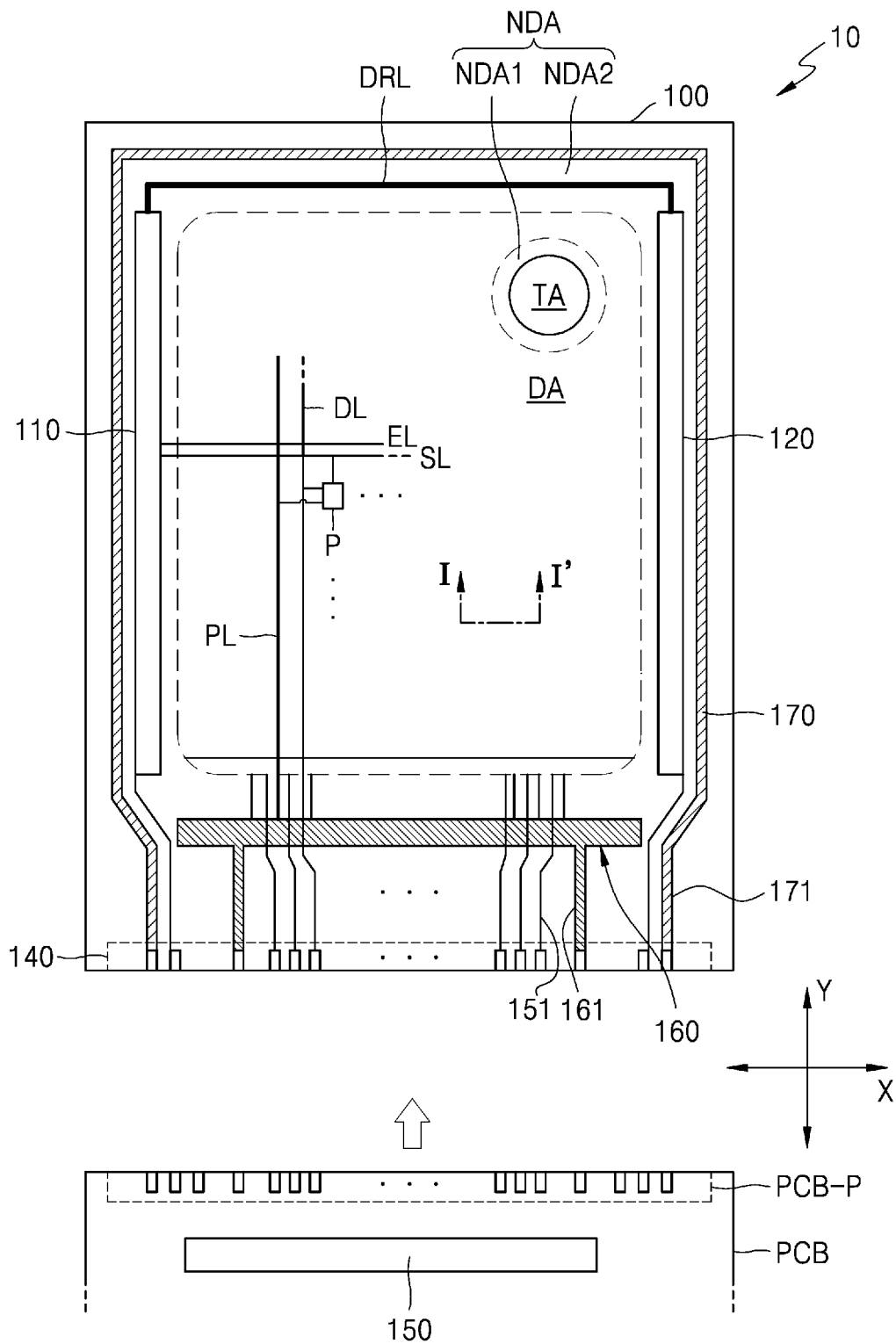
FIG. 4 is a schematic plan view of a display panel according to some example embodiments.

FIG. 4 is a schematic plan view of a display panel 10 according to some example embodiments.

Referring to FIG. 4, the display panel 10 includes a plurality of pixels P arranged in a display area DA. The pixels P may each include a display element such as an organic light-emitting diode. The pixels P may each emit, for example, red light, green light, blue light, or white light through the organic light-emitting diode The term "pixel P" as used herein may be understood as a subpixel that emits one of red light, green light, blue light, and white light as described above. The display area DA may be covered with the encapsulation member described above with reference to FIGS. 2A to 3C and protected from external air, moisture, or the like.

A transmission area TA may be partially surrounded by the display area DA. Therefore, the pixels P are arranged around the transmission area TA. The pixels P may be arranged to surround at least a portion of the transmission area TA, and a first non-display area NDA1 in which the pixels P are not arranged is located between the transmission area TA and the display area DA. In the first non-display area NDA1, wirings configured to apply a certain signal or voltage to the pixels P apart from the transmission area TA may be bypassed. Some wirings may be formed by being disconnected with the transmission area TA therebetween.

The pixels P may be electrically connected to internal circuits arranged in a second non-display area NDA2. A first scan driving circuit 110, a second scan driving circuit 120, a terminal 140, a data driving circuit 150, a first power supply line 160, and a second power supply line 170 may be arranged in the second non-display area NDA2.

The first scan driving circuit 110 may provide a scan signal to each pixel P via a scan line SL. The first scan driving circuit 110 may provide an emission control signal to each pixel P via an emission control line EL. The second scan driving circuit 120 may be arranged in parallel with the first scan driving circuit 110 with the display area DA therebetween. Some pixels P arranged in the display area DA may be electrically connected to the first scan driving circuit 110, and the others thereof may be electrically connected to the second scan driving circuit 120.

The first scan driving circuit 110 and the second scan driving circuit 120 may be connected to each other by a driver line DRL. A plurality of driver lines DRL may be provided and may be configured to transmit a gate driving high voltage Vgh, a gate driving low voltage Vgl, a start signal FLM, and the like. The gate driving high voltage Vgh and the gate driving low voltage Vgl may be voltages for driving the first scan driving circuit 110 and the second scan driving circuit 120. Because the first scan driving circuit 110 and the second scan driving circuit 120 are connected by the driver line DRL, luminance deviation of the display apparatus 1 may be significantly reduced. In some example embodiments, the driver line DRL may be omitted.

The terminal 140 may be arranged at one side of the substrate 100. The terminal 140 may be exposed without being covered with an insulating layer and thus electrically connected to a printed circuit board PCB. A terminal PCB-P of the printed circuit board PCB may be electrically connected to the terminal 140 of the display panel 10. The printed circuit board PCB may transmit a signal or power of a controller to the display panel 10. Control signals generated by a controller may be transmitted to the first and second scan driving circuits 110 and 120 through the printed circuit board PCB, respectively. The controller may provide a driving voltage and a common voltage (see ELVDD and ELVSS in FIGS. 5A and 5B to be described below) to the first and second power supply lines 160 and 170 via first and second connection lines 161 and 171, respectively.

The driving voltage ELVDD may be provided to each pixel P via a driving voltage line PL connected to the first power supply line 160, and the common voltage ELVSS may be provided to an opposite electrode of the pixel P connected to the second power supply line 170. The second power supply line 170 may partially surround the display area DA in a loop shape with one side open.

The data driving circuit 150 may be electrically connected to a data line DL. A data signal of the data driving circuit 150 may be provided to each pixel P via a connection line 151 connected to the terminal 140 and the data line DL connected to the connection line 151. FIG. 4 illustrates that the data driving circuit 150 is arranged on the printed circuit board PCB, but according to some example embodiments, the data driving circuit 150 may be arranged on the substrate 100. For example, the data driving circuit 150 may be between the terminal 140 and the first power supply line 160.

The first power supply line 160 may be connected to a terminal connection line 161 to receive the driving voltage ELVDD from the controller connected to the terminal 140. The first power supply line 160 may be arranged to correspond to the string of all the pixels P arranged in the first direction and may be configured to transmit the driving voltage ELVDD to the string of the pixels P.

Figure 5A:
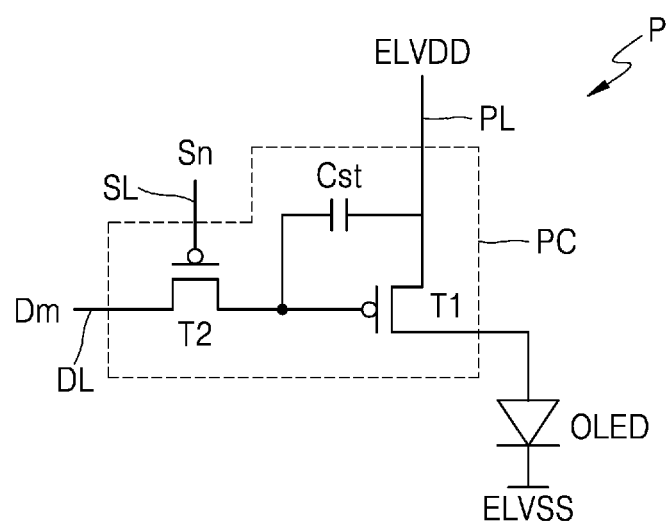
FIGS. 5A and 5B are equivalent circuit diagrams of a pixel in a display apparatus, according to some example embodiments.
Figure 5B:
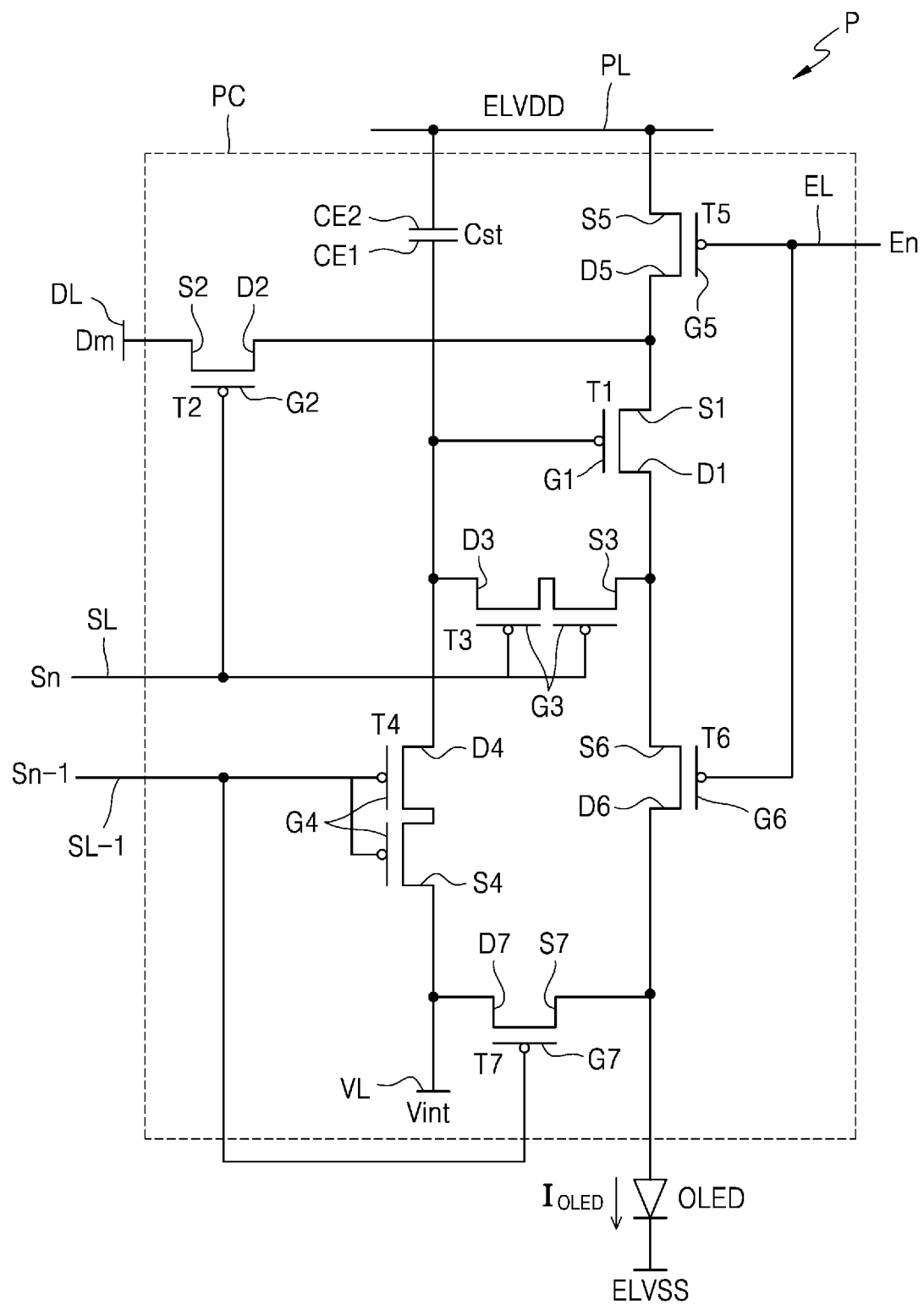

FIGS. 5A and 5B are equivalent circuit diagrams of pixels P that are applicable to embodiments.

Referring to FIG. 5A, the pixel PX includes a pixel circuit PC connected to a scan line SL and a data line DL, and an organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and is configured to transmit, to the driving thin-film transistor T1, a data signal Dm input via the data line DL according to a scan signal Sn input via the scan line SL.

The storage capacitor Cst is connected to the switching thin-film transistor T2 and a driving voltage line PL and is configured to store a voltage corresponding to a difference between a voltage received from the switching thin-film transistor T2 and a first power supply voltage ELVDD (or a driving voltage) supplied to the driving voltage line PL.

The driving thin-film transistor T1 is connected to the driving voltage line PL and the storage capacitor Cst and is configured to control a driving current flowing from the driving voltage line PL to the organic light-emitting diode OLED according to a voltage value stored in the storage capacitor Cst. The organic light-emitting diode OLED may emit light having a certain luminance according to the driving current.

FIG. 5A illustrates that the pixel circuit PC includes two thin-film transistors and one storage capacitor, but according to some example embodiments, the number of thin-film transistors and the number of storage capacitors may be variously changed.

For example, as illustrated in FIG. 5B, the pixel circuit PC may include seven thin-film transistors and one storage capacitor.

Referring to FIG. 5B, a pixel PX includes a pixel circuit PC and an organic light-emitting diode OLED connected to the pixel circuit PC. The pixel circuit PC may include a plurality of thin-film transistors and a storage capacitor. The thin-film transistors and the storage capacitor may be connected to signal lines SL, SL-1, EL, and DL, an initialization voltage line VL, and a driving voltage line PL.

FIG. 5B illustrates that the pixel P is connected to the signal lines SL, SL-1, EL, and DL, the initialization voltage line VL, and the driving voltage line PL, but embodiments according to the disclosure are not limited thereto. According to some example embodiments, at least one of the signal lines SL, SL-1, EL, or DL, the initialization voltage line VL, or the driving voltage line PL may be shared with adjacent pixels.

The thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The signal lines may include a scan line SL configured to transmit a scan signal Sn, a previous scan line SL-1 configured to transmit a previous scan signal Sn-1 to the first initialization thin-film transistor T4 and the second initialization thin-film transistor T7, an emission control line EL configured to transmit an emission control signal En to the operation control thin-film transistor T5 and the emission control thin-film transistor T6, and a data line DL intersecting the scan line SL and configured to transmit a data signal Dm. The driving voltage line PL is configured to transmit a driving voltage ELVDD to the driving thin-film transistor T1, and the initialization voltage line VL is configured to transmit an initialization voltage Vint initializing the driving thin-film transistor T1 and a pixel electrode.

A driving gate electrode G1 of the driving thin-film transistor T1 is connected to a first electrode CE1 of the storage capacitor Cst. A driving source electrode S1 of the driving thin-film transistor T1 is connected to a lower driving voltage line PL via the operation control thin-film transistor T5. A driving drain electrode D1 of the driving thin-film transistor T1 is connected to the pixel electrode of the organic light-emitting diode OLED via the emission control thin-film transistor T6. The driving thin-film transistor T1 receives the data signal Dm according to a switching operation of the switching thin-film transistor T2 and supplies a driving current IDLED to the organic light-emitting diode OLED.

A switching gate electrode G2 of the switching thin-film transistor T2 is connected to the scan line SL. A switching source electrode S2 of the switching thin-film transistor T2 is connected to the data line DL. A switching drain electrode D2 of the switching thin-film transistor T2 is connected to the driving source electrode S1 of the driving thin-film transistor T1 and connected to the lower driving voltage line PL via the operation control thin-film transistor T5. The switching thin-film transistor T2 is turned on according to the scan signal Sn received via the scan line SL and performs a switching operation to transmit the data signal Dm on the data line DL to the driving source electrode S1 of the driving thin-film transistor T1.

A compensation gate electrode G3 of the compensation thin-film transistor T3 is connected to the scan line SL. A compensation source electrode S3 of the compensation thin-film transistor T3 is connected to the driving drain electrode D1 of the driving thin-film transistor T1 and connected to the pixel electrode of the organic light-emitting diode OLED via the emission control thin-film transistor T6. A compensation drain electrode D3 of the compensation thin-film transistor T3 is connected to the first electrode CE1 of the storage capacitor Cst, a first initialization drain electrode D4 of the first initialization thin-film transistor T4, and the driving gate electrode G1 of the driving thin-film transistor T1. The compensation thin-film transistor T3 is turned on according to the scan signal Sn received through the scan line SL and connects the driving gate electrode G1 of the driving thin-film transistor T1 to the driving drain electrode D1 of the driving thin-film transistor T1 to diode-connect the driving thin-film transistor T1.

A first initialization gate electrode G4 of the first initialization thin-film transistor T4 is connected to the previous scan line SL-1. A first initialization source electrode S4 of the first initialization thin-film transistor T4 is connected to a second initialization drain electrode D7 of the second initialization thin-film transistor T7 and the initialization voltage line VL. The first initialization drain electrode D4 the first initialization thin-film transistor T4 is connected to the first electrode CE1 of the storage capacitor Cst, the compensation drain electrode D3 of the compensation thin-film transistor T3, and the driving gate electrode G1 of the driving thin-film transistor T1. The first initialization thin-film transistor T4 is turned on according to the previous scan signal Sn-1 received via the previous scan line SL-1 and performs an initialization operation to transmit the initialization voltage Vint to the driving gate electrode G1 of the driving thin-film transistor T1 to initialize the voltage of the driving gate electrode G1 of the driving thin-film transistor T1.

An operation control gate electrode G5 of the operation control thin-film transistor T5 is connected to the emission control line EL. An operation control source electrode S5 of the operation control thin-film transistor T5 is connected to the lower driving voltage line PL. An operation control drain electrode D5 of the operation control thin-film transistor T5 is connected to the driving source electrode S1 of the driving thin-film transistor T1 and the switching drain electrode D2 of the switching thin-film transistor T2.

An emission control gate electrode G6 of the emission control thin-film transistor T6 is connected to the emission control line EL. An emission control source electrode S6 of the emission control thin-film transistor T6 is connected to the driving drain electrode D1 of the driving thin-film transistor T1 and the compensation source electrode S3 of the compensation thin-film transistor T3. An emission control drain electrode D6 of the emission control thin-film transistor T6 is connected to a second initialization source electrode S7 of the second initialization thin-film transistor T7 and the pixel electrode of the organic light-emitting diode OLED.

The operation control thin-film transistor T5 and the emission control thin-film transistor T6 are simultaneously turned on according to the emission control signal En received via the emission control line EL and transmits the driving voltage ELVDD to the organic light-emitting diode OLED such that the driving current IDLED flows through the organic light-emitting diode OLED.

A second initialization gate electrode G7 of the second initialization thin-film transistor T7 is connected to the previous scan line SL-1. The second initialization source electrode S7 of the second initialization thin-film transistor T7 is connected to the emission control drain electrode D6 of the emission control thin-film transistor T6 and the pixel electrode of the organic light-emitting diode OLED. A second initialization drain electrode D7 of the second initialization thin-film transistor T7 is connected to the first initialization source electrode S4 of the first initialization thin-film transistor T4 and the initialization voltage line VL. The second initialization thin-film transistor T7 is turned on according to the previous scan signal Sn-1 received via the previous scan line SL-1 and initializes the pixel electrode of the organic light-emitting diode OLED.

Although FIG. 5B illustrates that the first initialization thin-film transistor T4 and the second initialization thin-film transistor T7 are connected to the previous scan line SL-1, embodiments according to the disclosure are not limited thereto. According to some example embodiments, the first initialization thin-film transistor T4 may be connected to the previous scan line SL-1 and driven according to the previous scan signal Sn-1, and the second initialization thin-film transistor T7 may be connected to a separate signal line (e.g., a next scan line) and driven according to the signal transmitted to the scan line.

A second electrode CE2 of the storage capacitor Cst is connected to the driving voltage line PL, and the opposite electrode of the organic light-emitting diode OLED is connected to a common voltage ELVSS. Therefore, the organic light-emitting diode OLED may receive the driving current IDLED from the driving thin-film transistor T1 and emit light to display an image.

Although FIG. 5B illustrates that each of the compensation thin-film transistor T3 and the first initialization thin-film transistor T4 has a dual gate electrode, each of the compensation thin-film transistor T3 and the first initialization thin-film transistor T4 may have a single gate electrode.

Figure 6:
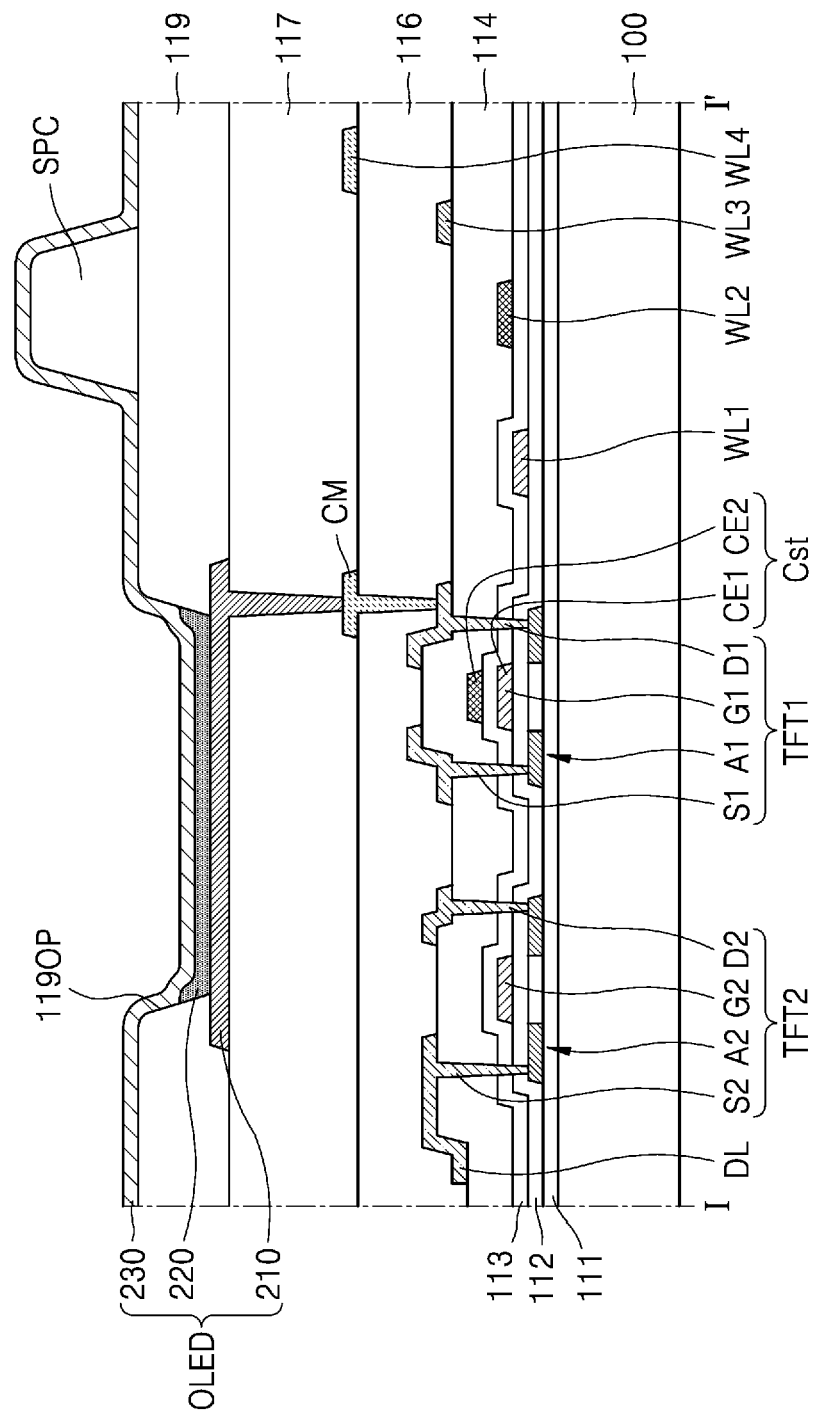
FIG. 6 is a schematic cross-sectional view of the display apparatus taken along the line I-I' of FIG. 4.

FIG. 6 is a cross-sectional view illustrating a portion of a stack structure of a display apparatus that is applicable to an embodiment.

Referring to FIG. 6, the display apparatus may include a substrate 100, thin-film transistors TFT1 and TFT2 arranged on the substrate 100, a storage capacitor Cst, an organic light-emitting diode OLED, and first to fourth wiring layers WL1 to WL4.

A buffer layer 111 may be arranged on the substrate 100. The buffer layer 111 may reduce or block penetration of foreign matter, moisture, or external air from the bottom of the substrate 100 and may provide a flat surface on the substrate 100. The buffer layer 111 may include an inorganic material, such as an oxide or nitride, an organic material, or an organic-inorganic composite material, and may have a single layer structure or a multilayer structure including an inorganic material or an organic material. A barrier layer may be further included between the substrate 100 and the buffer layer 111 to block penetration of external air.

The first thin-film transistor TFT1 may include a first semiconductor layer A1, a first gate electrode G1, a first source electrode S1, and a first drain electrode D1, and the second thin-film transistor TFT2 may include a second semiconductor layer A2, a second gate electrode G2, a second source electrode S2, and a second drain electrode D2. The first thin-film transistor TFT1 may be connected to the organic light-emitting diode OLED and function as a driving thin-film transistor that drives the organic light-emitting diode OLED. The second thin-film transistor TFT2 may be connected to a data line DL and function as a switching thin-film transistor. Although two thin-film transistors are illustrated in FIG. 6, embodiments according to the disclosure are not limited thereto. The number of thin-film transistors may be variously changed. For example, two to seven thin-film transistors may be provided.

The first semiconductor layer A1 and the second semiconductor layer A2 may include amorphous silicon or polycrystalline silicon. According to some example embodiments, the first and second semiconductor layers A1 and A2 may each include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The first and second semiconductor layers A1 and A2 may each include a channel region, and a source region and a drain region doped with impurities.

A first gate electrode G1 and a second gate electrode G2 may be respectively arranged on the first semiconductor layer A1 and the second semiconductor layer A2 with a first gate insulating layer 112 therebetween. The first gate electrode G1 and the second gate electrode G2 may each include molybdenum (Mo), aluminum (Al), copper (Cu), titanium (Ti), or the like and may each include a single layer or a multi-layer. For example, the first gate electrode G1 and the second gate electrode G2 may each include a single Mo layer.

The first gate insulating layer 112 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide (ZnO).

A second gate insulating layer 113 may be provided to cover the first gate electrode G1 and the second gate electrode G2. The second gate insulating layer 113 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide (ZnO).

A first electrode CE1 of the storage capacitor Cst may overlap the first thin-film transistor TFT1. For example, first gate electrode G1 of the first thin-film transistor TFT1 may function as the first electrode CE1 of the storage capacitor Cst.

A second electrode CE2 of the storage capacitor Cst overlaps the first electrode CE1 with the second gate insulating layer 113 therebetween. In this case, the second gate insulating layer 113 may function as a dielectric layer of the storage capacitor Cst. The second electrode CE2 may include a conductive material including molybdenum (Mo), aluminum (Al), copper (Cu), titanium (Ti), and the like and may include a single layer or a multi-layer including the above-described materials. For example, the second electrode CE2 may include a single Mo layer or a multi-layer of Mo/Al/Mo.

The first source electrode S1 and the first drain electrode D1, and the second source electrode S2 and the second drain electrode D2 may be arranged on an interlayer insulating layer 114. The first source electrode S1 and the first drain electrode D1, and the second source electrode S2 and the second drain electrode D2 may each include a conductive material including molybdenum (Mo), aluminum (Al), copper (Cu), titanium (Ti), and the like and may each include a single layer or a multi-layer including the above-described materials. For example, the first source electrode S1 and the first drain electrode D1, and the second source electrode S2 and the second drain electrode D2 may each have a multi-layer structure of Ti/Al/Ti.

A first planarization layer 116 and a second planarization layer 117 may be located on the first source electrode S1 and the first drain electrode D1, and the second source electrode S2 and the second drain electrode D2, and an organic light-emitting diode OLED may be located on the second planarization layer 117.

The first planarization layer 116 and the second planarization layer 118 may each include a single layer or a multi-layer including an organic material. The first planarization layer 116 and the second planarization layer 117 may each include a general-purpose polymer (e.g., benzocyclobutene (BCB), polyimide, polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and any blends thereof. The first planarization layer 116 and the second planarization layer 117 may include the same material or different materials.

The second planarization layer 117 may have a flat upper surface such that a pixel electrode 210 is formed to be flat. The organic light-emitting diode OLED may be arranged on the second planarization layer 117. The organic light-emitting diode OLED may include the pixel electrode 210, an intermediate layer 220 including an organic emission layer, and an opposite electrode 230.

The pixel electrode 210 of the organic light-emitting diode OLED may be connected to the first thin-film transistor TFT1 via a connection electrode CM arranged on the first planarization layer 116.

The first planarization layer 116 may include a contact hole connected to one of the first source electrode S1 and the first drain electrode D1 of the first thin-film transistor TFT1, and the connection electrode CM arranged on the first planarization layer 116 may be electrically connected to the first thin-film transistor TFT1 via the contact hole.

The pixel electrode 210 may include a transmissive electrode or a reflective electrode. In some example embodiments, the pixel electrode 210 may include a reflective layer and a transparent or semitransparent electrode layer arranged on the reflective layer. The reflective layer may include Ag, Mg, Al, Pt, Pd, Au, Ni, Nd, Ir, Cr, and any compounds thereof. The transparent or semitransparent electrode layer may include at least one selected from indium tin oxide (ITO), indium zinc oxide (IZO), zinc oxide (ZnO), indium oxide ($In_2O_3$), indium gallium oxide (IGO), and aluminum zinc oxide (AZO).

A pixel defining layer 119 may be arranged on the second planarization layer 117. Because the pixel defining layer 119 has an opening 1190P corresponding to each subpixel, that is, an opening 1190P exposing the central portion of at least the pixel electrode 210, the pixel defining layer 119 may define an emission area of a pixel. Also, the pixel defining layer 119 increases a distance between the edge of the pixel electrode 210 and the opposite electrode 230 above the pixel electrode 210, thereby preventing arcs or the like from occurring at the edge of the pixel electrode 210. The pixel defining layer 119 may include at least one organic insulating material selected from polyimide, polyamide, acrylic resin, benzocyclobutene, and phenol resin and may be formed by spin coating or the like.

A spacer SPC may be arranged on the pixel defining layer 119. The spacer SPC may be between a plurality of display elements and may protrude in a direction away from the substrate 100. According to some example embodiments, the spacer SPC may be an element for preventing a mask dent during a mask process. According to some example embodiments, the spacer SPC may change an optical path. The spacer SPC may include at least one organic insulating material selected from polyimide, polyamide, acrylic resin, benzocyclobutene, and phenol resin and may be formed by spin coating or the like. In some example embodiments, the spacer SPC may be simultaneously formed of the same material as that of the pixel defining layer 119 by a process using a half-tone mask.

The intermediate layer 220 of the organic light-emitting diode OLED may include an organic emission layer. The organic emission layer may include an organic material including a fluorescent or phosphorescent material that emits red, green, blue, or white light. The organic emission layer may include a low molecular weight organic material or a high molecular weight organic material. Functional layers such as a hole transport layer (HTL), a hole injection layer (HIL), an electron transport layer (ETL), and an electron injection layer (EIL) may optionally be further arranged below and above the organic emission layer. In some example embodiments, the intermediate layers 220 may be arranged corresponding to a plurality of pixel electrodes 210, respectively. According to some example embodiments, the intermediate layers 220 may be integrally provided over the pixel electrodes 210. For example, the organic emission layer may be arranged to correspond to each of the pixel electrodes 210, and functional layers arranged above and/or below the organic emission layer may be integrally provided over the pixels. According to some example embodiments, the intermediate layers 220 may be integrally provided over the pixel electrodes 210.

The opposite electrode 230 may include a transmissive electrode or a reflective electrode. In some example embodiments, the opposite electrode 230 may include a transparent or semitransparent electrode and may include a metal thin-film that has a low work function and includes Li, Ca, LiF/Ca, LiF/Al, Al, Ag, Mg, or any compounds thereof. Also, a transparent conductive oxide (TCO) layer such as ITO, IZO, ZnO, or $In_2O_3$ may be further arranged on the metal thin-film. The opposite electrodes 230 may be integrally formed in the organic light-emitting diodes OLED so as to correspond to the pixel electrodes 210.

A capping layer for improving light extraction efficiency and/or a protective layer for protecting the organic light-emitting diode OLED during a subsequent process may be further arranged above the opposite electrode 230.

The first to fourth wirings WL1 to WL4 may be configured to transmit electrical signals and/or constant voltage to the thin-film transistors TFT1 and TFT2 included in the pixel circuit.

The first wiring WL1 may be arranged on the first gate insulating layer 112 that is the same layer as the gate electrodes G1 and G2, and may function as the scan lines (see SL and SL-1 in FIGS. 5A and 5B) configured to transmit scan signals to the pixel circuit. Alternatively, the first wiring WL1 may function as the emission control line (see EL in FIG. 5B).

The second wiring WL2 may be arranged on the second gate insulating layer 113 that is the same layer as the second electrode CE2 of the storage capacitor Cst, and may function as the scan line SL and/or the light emission control line EL.

The third wiring WL3 may be arranged on the interlayer insulating layer 114 and may function as the data line DL configured to transmit the data signal to the pixel circuit. Alternatively, the third wiring WL3 may function as the driving voltage line PL (see PL in FIGS. 5A and 5B) configured to transmit the driving voltage to the pixel circuit.

The fourth wiring WL4 may be arranged on the first planarization layer 116. In some example embodiments, the fourth wiring WL4 may function as the driving voltage line configured to transmit the driving voltage to the pixel circuit. According to some example embodiments, the fourth wiring WL4 may function as the data line configured to transmit the data signal to the pixel circuit.

Figure 7:
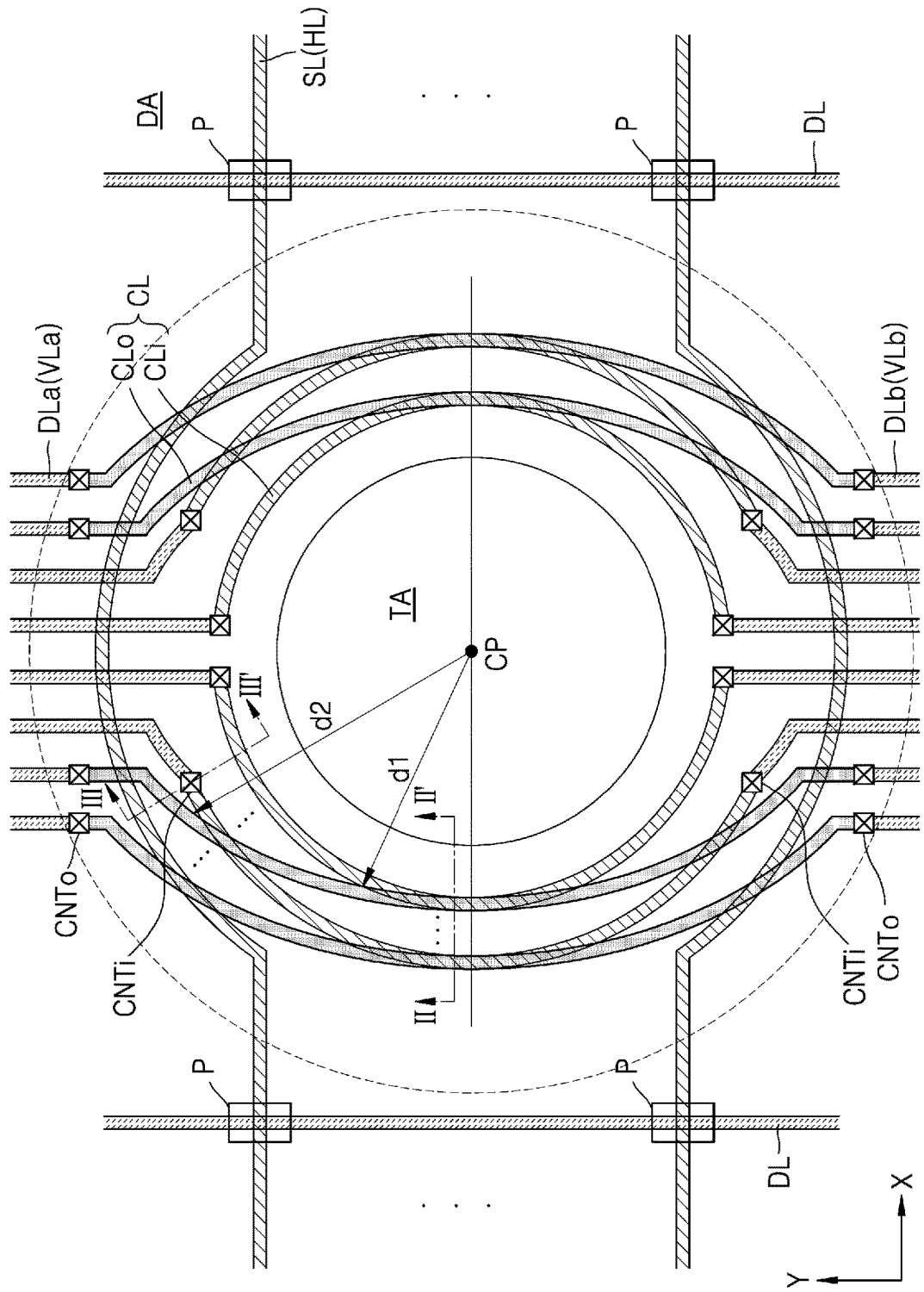
FIG. 7 is a plan view of wirings around a transmission area, according to some example embodiments.
Figure 8:
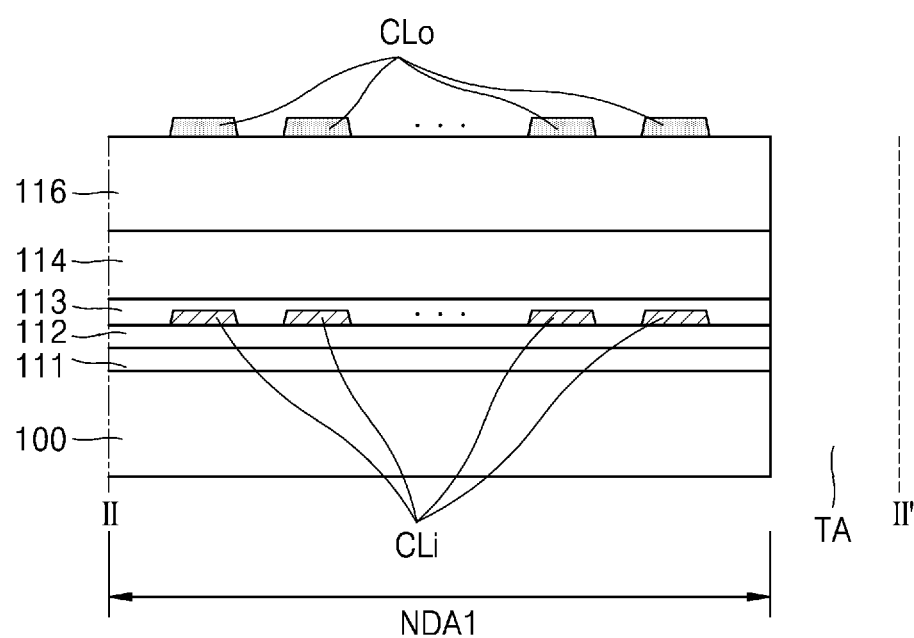
FIG. 8 is a schematic cross-sectional view taken along the line II-II' of FIG. 7, according to some example embodiments.
Figure 9:
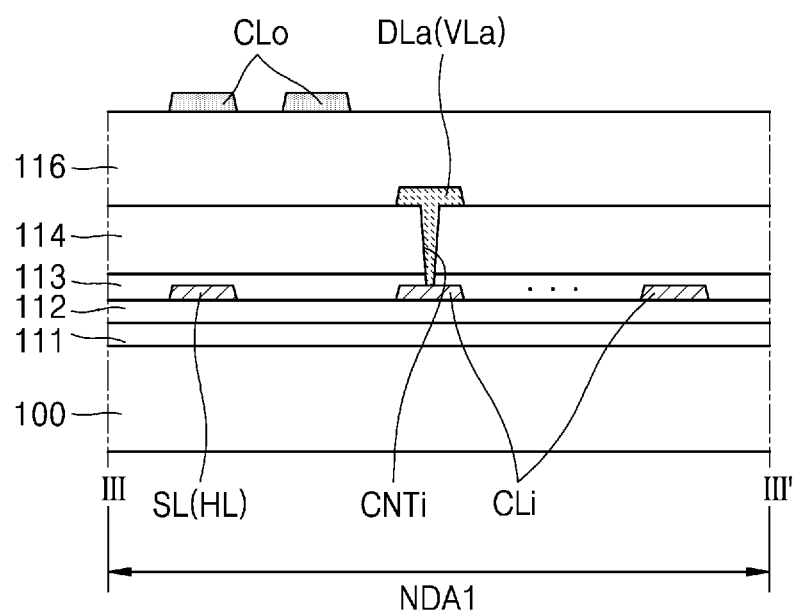
FIG. 9 is a schematic cross-sectional view taken along the line III-III' of FIG. 7, according to some example embodiments.

FIG. 7 is an enlarged plan view corresponding to the periphery of the transmission area TA of the display apparatus, according to some example embodiments, and FIGS. 8 and 9 are schematic cross-sectional views taken along the lines II-II' and III-III' of FIG. 7, respectively.

Referring to FIG. 7, a first non-display area NDA1 is arranged around the transmission area TA, and a display area DA is arranged to surround the transmission area TA and the first non-display area NDA1.

A plurality of pixels P and a plurality of signal lines configured to provide electrical signals to the pixels P may be arranged in the display area DA. Scan lines SL may extend in a first direction X, and data lines DL may extend in a second direction Y intersecting the first direction X.

According to some example embodiments, lines extending in the first direction are referred to as horizontal lines HL. Also, lines extending in the second direction and arranged above the transmission area TA are referred to as first vertical lines VLa, and lines arranged below the transmission area TA are referred to as second vertical lines VLb.

The horizontal lines HL may include a scan line SL, a previous scan line, a next scan line, and/or an emission control line. Although FIG. 7 illustrates that the horizontal lines HL extend continuously in the first direction, embodiments according to the disclosure are not limited thereto. The horizontal lines HL may include a first horizontal line arranged on the left side of the transmission area TA, and a second horizontal line arranged on the right side of the transmission area TA. The first horizontal line and the second horizontal line may be connected by a horizontal connection line arranged on a layer different from the first horizontal line. Alternatively, the first horizontal line and the second horizontal line may not be connected to each other. That is, the first horizontal line and the second horizontal line may be apart from each other with the transmission area TA therebetween.

The first vertical line VLa may include a first data line DLa, and the second vertical line VLb may include a second data line DLb. That is, the first data line DLa arranged above the transmission area TA may be apart from the second data line DLb arranged below the transmission area TA with the transmission area TA therebetween. The first data lines DLa and the second data lines DLb arranged on the same line in the second direction may be connected by connection lines CL.

The connection lines CL may be arranged in the first non-display area NDA surrounding the transmission area TA. The connection line CL may extend in the second direction (Y direction) to connect the first data line DLa to the second data line DLb, and may bypass along the edge of the transmission area TA in the first non-display area NDA1.

For example, when the transmission area TA is provided in a circular shape, the connection lines CL may be curved with a curvature along the edge of the transmission area TA.

Although FIG. 7 illustrates that the connection lines CL are curved arcs, the bypass portion may be provided as a line that is bent in zigzag.

The first data line DLa and the second data line DLb are apart from each other with respect to the transmission area TA so as to protect the pixels P from electrostatic discharge (ESD) that may occur near the transmission area TA.

Electrostatic charges may be collected around the transmission area TA that may include at least one opening, which may lead to a high probability of electrostatic discharge. When the lines arranged around the transmission area TA are continuously formed as one conductive layer, a high voltage due to electrostatic discharge may be directly applied to the pixels P as it is.

However, according to some example embodiments, because the first vertical lines VLa and the second vertical lines VLb arranged around the transmission area TA are connected by the connection lines CL, it is possible to prevent a high voltage due to electrostatic discharge from being directly applied to the pixels P.

The connection lines CL include first connection lines CLi and second connection lines CLo. Ends of the first connection lines CLi may be formed to be closer to the transmission area TA than ends of the second connection lines CLo.

According to some example embodiments, the first connection lines CLi may be arranged on a layer different from the second connection lines CLo, and the curvatures of the first connection lines CLi may be different from the curvatures of the second connection lines CLo. In the present specification, the curvature of the connection line CL means the degree to which the connection line CL is bent along the transmission area TA.

The first connection lines CLi may be arranged on the same layer as the first wiring WL1 described above with reference to FIG. 6. That is, the first connection lines CLi may be arranged on the same layer as the first gate electrode G1 of the first thin-film transistor TFT1. In some example embodiments, the first connection lines CLi may be arranged on the same layer as the scan line SL. Because the first connection lines CLi are arranged on the same layer as the scan line SL, it may be advantageous that the first connection lines CLi are arranged farther from the scan line SL than the second connection lines CLo in order to significantly reduce interference with the scan line SL extending in the first direction. That is, when the first connection lines CLi are formed to be closer to the transmission area TA than the second connection lines CLo, interference with the scan line SL may be significantly reduced.

The second connection lines CLo may be arranged on the same layer as the fourth wiring WL4 described above with reference to FIG. 6. That is, the second connection lines CLo may be arranged on the same layer as the connection electrode CM on the first planarization layer 116.

The first connection lines CLi may be bent with a curvature approximately identical to that of the transmission area TA. That is, when the transmission area TA is circular, the first connection lines CLi may be bent with a curvature approximately identical to that of the circle.

The second connection lines CLo may be bent with a curvature approximately identical to that of an ellipse having a major axis in the second direction. Therefore, distances from two different points on the second connection line CLo to the center point CP of the transmission area TA may be provided differently (d1≠d2). For example, the distance between one point on the second connection line CLo and the center point of the transmission area may become shorter toward the center of the second connection line CLo.

Because the curvatures of the first connection lines CLi and the curvatures of the second connection lines CLo are provided differently, the first connection lines CLi may be arranged to overlap the second connection lines CLo in a portion of the first non-display area NDA1. That is, in a plan view, the central portion of the first connection lines CLi may be arranged to overlap the central portion of the second connection lines CLo. Therefore, the area of the first non-display area NDA1 may be reduced.

Referring to FIG. 8, in a portion of the first non-display area NDA1, at least some of the first connection lines CLi may be arranged to overlap the second connection lines CLo. In some example embodiments, the first connection lines CLi may overlap the second connection lines CLo, respectively.

The first connection lines CLi may be arranged on the first gate insulating layer 112, and the second connection lines CLo may be arranged on the first planarization layer 116. In some example embodiments, the second gate insulating layer 113 and the interlayer insulating layer 114 including an inorganic insulating layer and the first planarization layer 116 including an organic insulating layer may be between the first connection lines CLi and the second connection lines CLo.

Referring back to FIG. 7, the first connection lines CLi may be connected to the first vertical lines VLa and the second vertical lines VLb via the first contact holes CNTi. The first vertical lines VLa and the second vertical lines VLb may be arranged on a layer different from the first connection lines CLi. For example, the first vertical lines VLa and the second vertical lines VLb may be arranged on the same layer as the third wiring WL3 described above with reference to FIG. 6.

The second connection lines CLo may be connected to the first vertical lines VLa and the second vertical lines VLb via the second contact holes CNTo. The second connection lines CLo may be arranged on a layer different from the first vertical lines VLa and the second vertical lines VLb.

The first contact holes CNTi may be formed to be closer to the transmission area TA than the horizontal lines HL. Alternatively, the first contact holes CNTi may be formed to be closer to the transmission area TA than the second contact holes CNTo. At least one of the first contact holes CNTi may be between the second connection line CLo and the first connection line CLi. In some example embodiments, the horizontal lines HL may be between the first contact holes CNTi and the second contact holes CNTo in the first non-display area NDA1. This may be an arrangement for significantly reducing interference between the first connection lines CLi and the horizontal lines HL. Also, this may be for reducing the area of the first non-display area NDA1.

Referring to FIG. 9, first connection lines CLi may be connected to first vertical lines VLa arranged above the first connection lines CLi via first contact holes CNTi. The first connection lines CLi may be arranged on a first gate insulating layer 112 and may be apart from each other on the same layer as horizontal lines HL. First vertical lines VLa may be arranged on an interlayer insulating layer 114 and may be a first data line DLa configured to transmit a data signal. The first contact hole CNTi may pass through the interlayer insulating layer 114 and the second gate insulating layer 113 and be connected to the first connection line CLi and the first vertical line VLa via the first contact hole CNTi Second connection lines CLo may be arranged on the interlayer insulating layer 114 and may overlap the horizontal line HL in some areas.

The first connection lines CLi and the second connection lines CLo according to some example embodiments may be provided with different curvatures in the first non-display area NDA1, and the first connection lines CLi and the second connection lines CLo may be arranged on different layers and may overlap in some areas. Therefore, the area of the first non-display area NDA1 may be reduced.

In the embodiment of FIGS. 7 and 8, the first connection lines CLi respectively overlap the second connection lines CLo along a virtual line of an X direction passing through the center point CP of the transmission area TA of the first connection line CLi, but embodiments according to the disclosure are not limited thereto.

Figure 10:
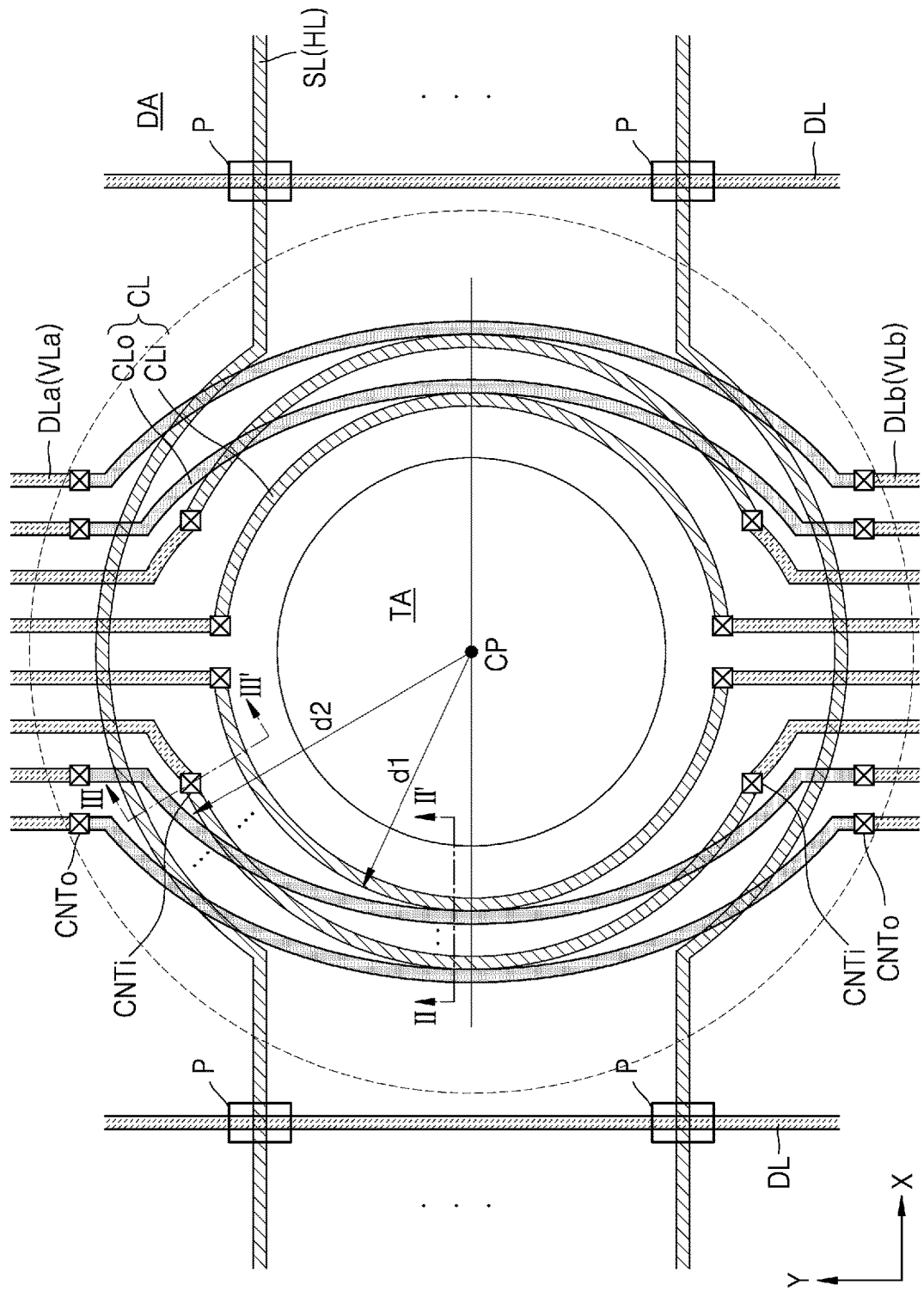
FIG. 10 is a plan view of wirings around a transmission area, according to some example embodiments.

FIG. 10 is a plan view of lines around a transmission area, according to some example embodiments. In FIG. 10, the same reference numerals as those in FIG. 7 refer to the same members.

Referring to FIG. 10, first connection lines CLi and second connection lines CLo may be provided with different curvatures in a first non-display area NDA1, and the first connection lines CLi and the second connection lines CLo may be arranged on different layers.

According to some example embodiments, the first connection lines CLi and the second connection lines CLo may be alternately arranged along a virtual line of a first direction X passing through a center point CP of a transmission area TA. Alternatively, the group of the first connection lines CLi and the group of the second connection lines CLo may be alternately arranged in the first direction X. In this case, the outermost connection line CL may be the second connection line CLo.

Figure 11:
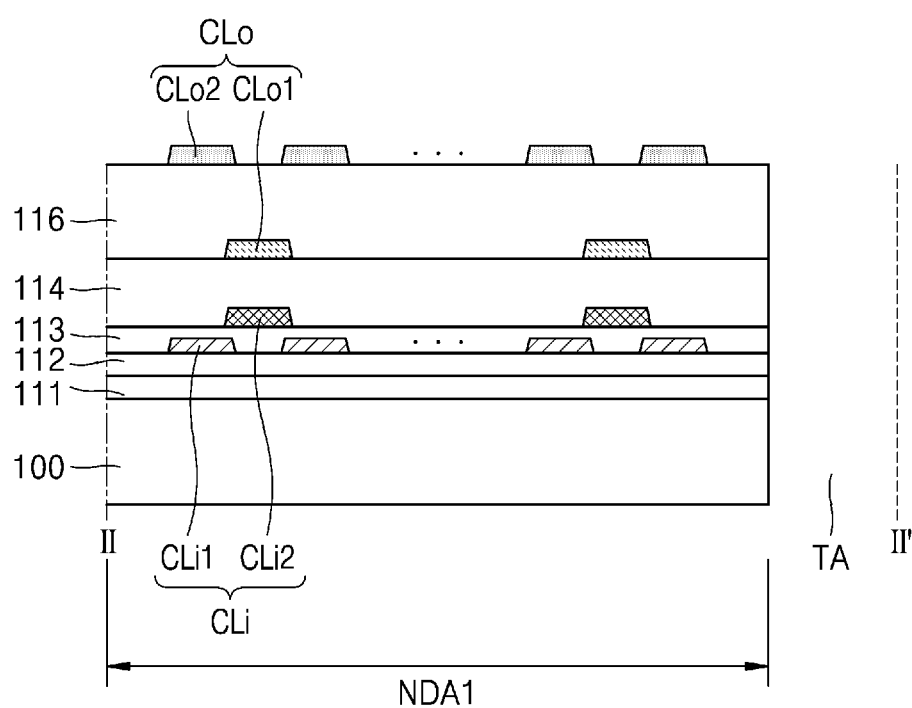
FIG. 11 is a schematic cross-sectional view taken along the line II-II' of FIG. 7, according to some example embodiments.
Figure 12:
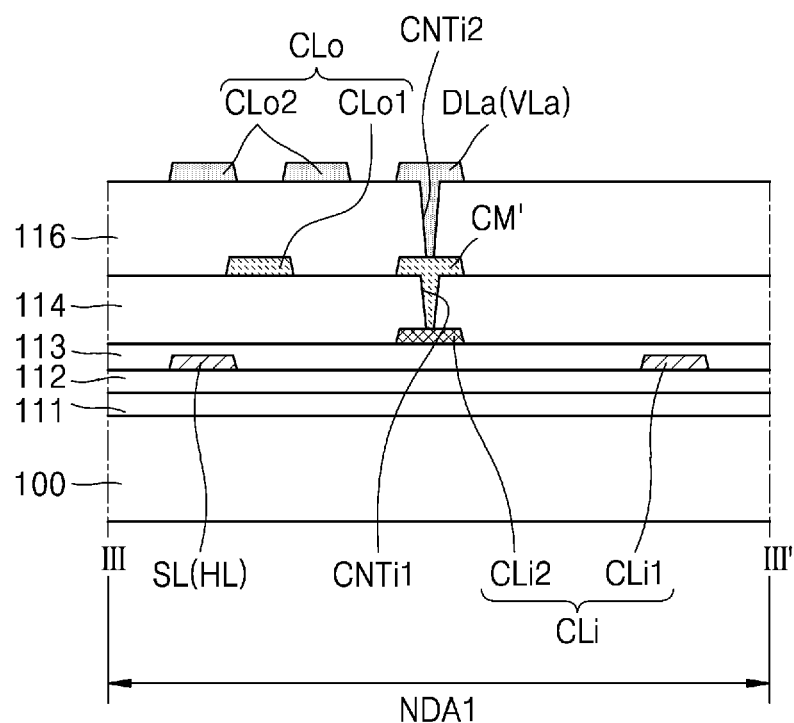
FIG. 12 is a schematic cross-sectional view taken along the line III-III' of FIG. 7, according to some example embodiments.

Because the first connection lines CLi and the second connection lines CLo are arranged on different layers, the first connection lines CLi and the second connection lines CLo may be arranged adjacent to each other. The first connection lines CLi may be bent with a curvature approximately identical to that of a circle, and the second connection lines CLo may be bent with a curvature approximately identical to that of an ellipse having a major axis in a second direction. Therefore, the area of the first non-display area NDA1 may be reduced. FIGS. 11 and 12 are schematic cross-sectional views taken along the lines II-II' and III-III' of FIG. 7, respectively. In FIGS. 11 and 12, the same reference numerals as those in FIGS. 8 and 9 refer to the same members, and a redundant description thereof will be omitted.

Referring to FIGS. 11 and 12, the first connection lines CLi may include $(1\text{-}1)^{th}$ connection lines CLi1 and $(1\text{-}2)^{th}$ connection lines CLi2 arranged on different layers. The $(1\text{-}1)^{th}$ connection lines CLi1 may be arranged on the same layer as the first wiring WL1 described above with reference to FIG. 6. That is, the $(1\text{-}1)^{th}$ connection lines CLi1 may be arranged on the first gate insulating layer 112. The $(1\text{-}2)^{th}$ connection lines CLi2 may be arranged on the same layer as the second wiring WL2 described above with reference to FIG. 6. That is, the $(1\text{-}2)^{th}$ connection lines CLi2 may be arranged on the second gate insulating layer 113. The $(1\text{-}1)^{th}$ connection lines CLi1 and the $(1\text{-}2)^{th}$ connection lines CLi2 may be alternately arranged with each other. According to some example embodiments, the $(1\text{-}1)^{th}$ connection lines CLi1 may be arranged to partially overlap the $(1\text{-}2)^{th}$ connection lines CLi2. Therefore, the area of the first non-display area NDA1 may be reduced.

The second connection lines CLo may include $(2\text{-}1)^{th}$ connection lines CLo1 and $(2\text{-}2)^{th}$ connection lines CLo2 arranged on different layers. The $(2\text{-}1)^{th}$ connection lines CLo1 may be arranged on the same layer as the third wiring WL3 described above with reference to FIG. 6. That is, the $(2-1)^{th}$ connection lines CLo1 may be arranged on the interlayer insulating layer 114. The $(2-2)^{th}$ connection lines CLo2 may be arranged on the same layer as the fourth wiring WL4 described above with reference to FIG. 6. That is, the $(2-2)^{th}$ connection lines CLo2 may be arranged on the first planarization layer 116. The $(2-1)^{th}$ connection lines CLo1 and the $(2-2)^{th}$ connection lines CLo2 may be alternately arranged with each other. According to some example embodiments, the $(2-1)^{th}$ connection lines CLo1 may be arranged to partially overlap the $(2-2)^{th}$ connection lines CLo2. Therefore, the area of the first non-display area NDA1 may be reduced.

First data lines DLa, which are first vertical lines VLa, may be arranged on a first planarization layer 116. In this case, the first vertical lines VLa may be connected to the first connection lines CLi via connection metals CM' arranged on the interlayer insulating layer 114. The first vertical lines VLa may be connected to the connection metals CM' via $(1-2)^{th}$ contact holes CNTi2 passing through the first planarization layer 116, and the connection metals CM' may be connected to the $(1-2)^{th}$ connection lines CLi2 via the $(1-1)^{th}$ contact holes CNTi1 passing through the interlayer insulating layer 114. Although FIG. 12 illustrates that the first vertical line VLa is connected to the $(1-2)^{th}$ connection line CLi2, embodiments according to the disclosure are not limited thereto. The first vertical line VLa may be connected to the $(1-1)^{th}$ connection line CLi1.

In the display apparatus according to some example embodiments, because the first connection lines CLi and the second connection lines CLo are arranged on different layers, the area of the first non-display area NDA1 may be further reduced.

The display apparatuses according to some example embodiments may reduce the non-display area around the transmission area. Also, because the wirings around the transmission area are connected via the connection lines, the display apparatus may prevent damage due to electrostatic discharge. These effects are merely an example, and the scope of embodiments according to the disclosure are not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalent.

What is claimed is:

1. A display apparatus comprising:
   a substrate having a transmission area and a display area surrounding the transmission area;
   a plurality of display elements in the display area;
   a horizontal line extending in a first direction in the display area;
   a plurality of first vertical lines and a plurality of second vertical lines extending in a second direction intersecting the first direction and being apart from each other with the transmission area therebetween;
   a first connection line connecting at least one of the plurality of first vertical lines to at least one of the plurality of second vertical lines, and bypassing the transmission area; and
   a second connection line connecting at least another one of the plurality of first vertical lines to at least another one of the plurality of second vertical lines and bypassing the transmission area, the second connection line being on a layer different from the first connection line,
   wherein a curvature of the first connection line is different from a curvature of the second connection line, and the curvature of the second connection line overlaps at least part of the curvature of the first connection line along the transmission area in a plan view.

2. The display apparatus of claim 1, wherein the first connection line is closer to the transmission area than the second connection line, and a distance between a point on the second connection line and a center point of the transmission area becomes shorter toward a center of the second connection line.

3. The display apparatus of claim 1, wherein the first connection line is on the same layer as the horizontal line.

4. The display apparatus of claim 1, wherein the first connection line is connected to the at least one of the plurality of first vertical lines via a first contact hole, and the first contact hole is between the second connection line and the transmission area.

5. The display apparatus of claim 1, wherein the first connection line is connected to the at least one of the plurality of first vertical lines via a first contact hole, the second connection line is connected to the at least one of the plurality of first vertical lines via a second contact hole, and the first contact hole is formed to be closer to the transmission area than the second contact hole.

6. The display apparatus of claim 1, wherein a thin-film transistor comprising a first semiconductor layer and a first gate electrode is in the display area, and the first connection line is on the same layer as the first gate electrode.

7. The display apparatus of claim 6, further comprising:
   a data line connected to the thin-film transistor; and
   a first planarization layer covering the data line,
   wherein the second connection line is on the first planarization layer.

8. The display apparatus of claim 1, wherein the first connection line comprises a plurality of $(1-1)^{th}$ connection lines and a plurality of $(1-2)^{th}$ connection lines arranged on different layers, wherein the plurality of $(1-1)^{th}$ connection lines and the plurality of $(1-2)^{th}$ connection lines are alternately arranged.

9. The display apparatus of claim 1, wherein the second connection line comprises a plurality of $(2-1)^{th}$ connection lines and a plurality of $(2-2)^{th}$ connection lines arranged on different layers, wherein the plurality of $(2-1)^{th}$ connection lines and the plurality of $(2-2)^{th}$ connection lines are alternately arranged.

10. A display apparatus comprising:
    a substrate having a transmission area, a display area surrounding the transmission area, and a non-display area between the transmission area and the display area;
    a plurality of display elements in the display area;
    a horizontal line extending in a first direction in the display area;
    a plurality of first vertical lines and a plurality of second vertical lines extending in a second direction intersecting the first direction and being apart from each other with the transmission area therebetween;
    a first connection line in the non-display area and connecting at least one of the plurality of first vertical lines to at least one of the plurality of second vertical lines via a first contact hole; and a second connection line in the non-display area and connecting at least another one of the plurality of first vertical lines to at least another one of the plurality of second vertical lines via a second contact hole, wherein the first contact hole is formed to be closer to the transmission area than the second contact hole, and wherein a curved portion of the second connection line overlaps at least part of a curved portion of the first connection line along the transmission area in a plan view.

11. The display apparatus of claim 10, wherein the horizontal line is bent to bypass the transmission area in the non-display area, and the horizontal line is between the first contact hole and the second contact hole.

12. The display apparatus of claim 10, wherein a curvature of the first connection line is different from a curvature of the second connection line.

13. The display apparatus of claim 10, wherein the first connection line has a curvature identical to that of a circle, and the second connection line has a curvature identical to that of an ellipse.

14. The display apparatus of claim 10, wherein a central portion of the first connection line overlaps a central portion of the second connection line in the plan view.

15. The display apparatus of claim 10, wherein a thin-film transistor comprising a first semiconductor layer and a first gate electrode is in the display area, wherein the first connection line is on the same layer as the first gate electrode.

16. The display apparatus of claim 15, further comprising:
a data line connected to the thin-film transistor; and
a first planarization layer covering the data line,
wherein the second connection line is on the first planarization layer.

17. The display apparatus of claim 10, wherein the first connection line is provided on the same layer as the horizontal line.

18. The display apparatus of claim 10, wherein the first connection line comprises a plurality of $(1-1)^{th}$ connection lines and a plurality of $(1-2)^{th}$ connection lines arranged on different layers, wherein the plurality of $(1-1)^{th}$ connection lines and the plurality of $(1-2)^{th}$ connection lines are alternately arranged.

19. The display apparatus of claim 10, wherein the second connection line comprises a plurality of $(2-1)^{th}$ connection lines and a plurality of $(2-2)^{th}$ connection lines arranged on different layers, wherein the plurality of $(2-1)^{th}$ connection lines and the plurality of $(2-2)^{th}$ connection lines are alternately arranged.

* * * * *